(12) United States Patent
French et al.

(10) Patent No.: US 9,843,741 B2
(45) Date of Patent: Dec. 12, 2017

(54) HYBRID PIXEL SENSOR ARRAY

(71) Applicant: The Science and Technology Facilities Council, Didcot, Oxfordshire (GB)

(72) Inventors: Marcus Julian French, Abingdon (GB); Matthew Charles Veale, Reading (GB)

(73) Assignee: THE SCIENCE AND TECHNOLOGY FACILITIES COUNCIL, Didcot, Oxfordshire (GB)

( * ) Notice: Subject to any disclaimer, the term of this patent is extended or adjusted under 35 U.S.C. 154(b) by 0 days.

(21) Appl. No.: 15/100,077

(22) PCT Filed: Nov. 28, 2014

(86) PCT No.: PCT/GB2014/053536
§ 371 (c)(1),
(2) Date: May 27, 2016

(87) PCT Pub. No.: WO2015/079250
PCT Pub. Date: Jun. 4, 2015

(65) Prior Publication Data
US 2017/0006236 A1 Jan. 5, 2017

(30) Foreign Application Priority Data
Nov. 29, 2013 (GB) .................................. 1321050.5

(51) Int. Cl.
*H04N 5/32* (2006.01)
*H01L 27/146* (2006.01)
(Continued)

(52) U.S. Cl.
CPC ........... *H04N 5/32* (2013.01); *H01L 27/1465* (2013.01); *H01L 27/14609* (2013.01);
(Continued)

(58) Field of Classification Search
CPC ...... H04N 5/32; H04N 3/155; H04N 5/37452; H04N 5/369; H04N 5/37213;
(Continued)

(56) References Cited

U.S. PATENT DOCUMENTS

| 5,355,165 A | 10/1994 | Kosonocky et al. |
| 6,035,013 A | 3/2000 | Orava et al. |

(Continued)

FOREIGN PATENT DOCUMENTS

| EP | 2 299 696 A1 | 3/2011 |
| EP | 2 477 393 A1 | 7/2012 |
| WO | WO 97/46004 | 12/1997 |

*Primary Examiner* — Gevell Selby
(74) *Attorney, Agent, or Firm* — Preti Flaherty Beliveau & Pachios LLP

(57) ABSTRACT

A hybrid pixel sensor array is provided. Each pixel of the array comprises: a sensor for generating an imaging signal; a Charged-Coupled Device (CCD) array, coupled to the sensor so as to receive samples from the imaging signal and configured for storage of a plurality of samples; and active CMOS circuitry, coupled to the CCD array for generating a pixel output signal from the stored samples. The sensors of the pixels are part of a sensor portion of the hybrid pixel sensor array that is separate from both the CCD array and active CMOS circuitry of the pixels.

31 Claims, 4 Drawing Sheets

(51) Int. Cl.
*H04N 5/369* (2011.01)
*H04N 5/372* (2011.01)
*H01L 27/148* (2006.01)
*H04N 3/14* (2006.01)
*H04N 5/3745* (2011.01)

(52) U.S. Cl.
CPC .. *H01L 27/14634* (2013.01); *H01L 27/14661* (2013.01); *H01L 27/14806* (2013.01); *H04N 3/155* (2013.01); *H04N 5/369* (2013.01); *H04N 5/37213* (2013.01); *H04N 5/37452* (2013.01)

(58) Field of Classification Search
CPC ........... H01L 27/14806; H01L 27/1465; H01L 27/14661; H01L 27/14634; H01L 27/14609
See application file for complete search history.

(56) References Cited

U.S. PATENT DOCUMENTS

| | | | |
|---|---|---|---|
| 7,868,665 B2 * | 1/2011 | Turner | H03F 3/087 327/509 |
| 2003/0052983 A1 | 3/2003 | Altree | |
| 2006/0274171 A1 * | 12/2006 | Wang | G06K 7/14 348/294 |
| 2009/0256156 A1 * | 10/2009 | Hsieh | H01L 27/14609 257/72 |
| 2014/0263952 A1 * | 9/2014 | Taghibakhsh | H04N 5/378 250/208.1 |
| 2014/0267855 A1 * | 9/2014 | Fan | H01L 27/14806 348/302 |

* cited by examiner

HYBRID PIXEL SENSOR ARRAY

TECHNICAL FIELD OF THE INVENTION

The invention concerns a hybrid pixel sensor array.

BACKGROUND TO THE INVENTION

The European XFEL is a facility designed to generate ultra-short X-ray flashes at 27,000 times per second and with a high brilliance and beam energy, which is initially 12 keV (monoenergetic) but may be increased to higher energies. The facility will deliver very short pulses of spatially coherent laser light and the experimental end-stations will each contain additional light sources with different characteristics that combine to probe scientific samples. High speed detection of X-rays with customised instrumentation and a high dynamic range is highly desirable therefore presents a novel challenge.

A number of technologies exist in the area of high speed X-ray detection. For example, U.S. Pat. No. 7,868,665 describes a known hybrid sensor design, in which a CdZnTe detector is bonded to a readout Application Specific Integrated Circuit (ASIC) by Indium bump-bonding.

"Medipix3: A 64 k pixel detector redial chip working in single photon counting mode with improved spectra metric performance", Ballabriga et al, Nuclear Instruments and Methods in Physics Research A 633 (2011) S15-S18, describes a hybrid pixel detector that uses a charge summing architecture, such that the charge in every cluster of four pixels is added and assigned to the pixel with the largest charge deposition asynchronously on an event-by-event basis. Data acquisition and readout can be performed either sequentially or continuously.

There are separate development programmes for customised systems specifically tailored for XFEL that are currently in development.

"Development of the LPD, a high dynamic range pixel detector for the European XFEL", Hart et al, 2012 IEEE Nuclear Science Symposium and Medical Imaging Conference Record, P534-537 describes a sensor capable of a 4.5 MHz rate and high dynamic range. It is formed from 4096 pixel detector tiles with 500 µm pixels. The charge is read out by a custom ASIC. Eight ASICs are bonded to each sensor with 512 pixelated readout channels on each ASIC. A large and complex structure is needed to meet the demanding requirements.

"Electronics for the European XFEL: AGIPD a high frame rate camera", P. Gottlicher, Topical Workshop on Electronics for Particle Physics 2010, IOP Publishing describes a detector array with electronics that automatically adds feedbacks capacitors to the input stage of the amplifier to avoid charge losses. Two capacitive pipelines store the analogue value and the used gain during the bunch data processing. The stored analogue value and gain for 1024 pixels are multiplexed into a single output line. Again, a large and complex design is necessitated.

Whilst these developments are on-going, in the separate area of UV and visible light imaging, new techniques have been developed for achieving higher frame rates. For example, our co-pending patent application GB1300190.4 (incorporated herein by reference in its entirety) and "Kirana: A Solid State Megapixel uCMOS image sensor for ultra-high speed imaging" Crooks et al, Proc. of SPIE Vol 8659, 865903 describe an active pixel sensor (APS) array of 30 µm pixels each containing a pinned photodiode, a set of 180 low-leakage storage cells, a floating-diffusion and a source follower output structure. In a fast mode, the storage cells are operated as a circular buffer, where 180 consecutive frames are stored until receipt of a trigger. In a 'slow' mode, the storage cell acts a pipeline and a sensor can be read out like a conventional sensor at a continuous frame rate of 1,180 fps. The sensor ASIC can be manufactured using a 180 nm CMOS technology. However, the Kirana sensor was not designed for X-ray applications.

SUMMARY OF THE INVENTION

Against this background, the present invention provides an hybrid pixel sensor array, each pixel of the array comprising: a sensor for generating an imaging (detection) signal; a charge-coupled device (CCD) array, coupled to the sensor so as to receive samples from the imaging signal and configured for storage of a plurality of samples; and active CMOS circuitry, coupled to the CCD array for generating a pixel output signal from the stored samples. The sensors of the pixels are preferably part of a sensor portion of the hybrid pixel sensor array that is separate from both the CCD array and active CMOS circuitry of the pixels.

This therefore combines the hybrid sensor technology with the Kirana architecture that is known in the field of photo imaging, but never previously considered relevant outside of this area. It has now been recognised that the Kirana technology can provide significant benefits in the area of X-ray imaging and other types of imaging where hybrid sensors are beneficial. This may provide benefits in speed and radiation hardness (especially when sensor materials with high stopping power are used) over existing designs.

Preferably, the hybrid pixel sensor array comprises a plurality of pixels. Advantageously, the X-ray sensors of the pixels are arranged in a two-dimensional array on the sensor portion. Preferably, the sensor portion comprises a sensor tile, which is beneficially separated from the CCD array and active CMOS circuitry of the pixels in a third dimension, different from the two dimensions of the array. The sensor tile may have a thickness of at least 300 µm, 400 µm, 500 µm, 600 µm, 700 µm, 800 µm, 900 µm or 1 mm. The thickness may further improve radiation hardness and prevent damage to the circuitry underneath.

In embodiments, the CCD array and active CMOS circuitry of the pixels are formed on a readout Application Specific Integrated Circuit, ASIC. Preferably, the sensor tile is bonded to the readout ASIC, providing the hybrid sensor design. More preferably, the sensor tile is bonded to the readout ASIC using at least one bump-bond pad. Most preferably, the at least one bump-bond pad comprises Indium. In less preferred embodiments, the sensor tile is bonded to the readout ASIC using solder. Advantageously, the sensor tile is bonded to the readout ASIC in a flip-chip arrangement. The bonding between the sensor tile and the readout ASIC may provide the coupling between the sensor of each pixel on the sensor tile and the CCD array of the respective pixel on the readout ASIC. In the preferred embodiment, the readout ASIC is essentially identical to the sensor described in our co-pending patent application GB1300190.4, except that the photodetector of that sensor may be omitted or replaced by other circuitry, such as described herein.

In the preferred embodiment, the biasing circuitry, configured to provide a biasing voltage across the sensor of each pixel. Where the sensor tile is used, a relatively high DC voltage (such as at least 100V, 200V, 500V or 1 kV) may be applied to one side of the sensor tile. The other side of the sensor tile may be held at a relatively low DC voltage or DC ground and it may only be this side of the sensor tile that is pixelated. The biasing circuitry is advantageously configured to control the biasing conditions such that the impedance of the sensor seen from the readout ASIC is the same for each pixel and preferably, low.

Beneficially, the pitch of the sensor for each pixel is no greater than 100 microns or, more preferably, 60 microns.

The material of the sensor may affect its properties. In particular, the sensor may advantageously be an X-ray sensor, although detection of other types of radiation (such as infrared) may be possible. Suitable materials for the sensor may include CdTe, CdZnTe, HgCdTe, GaAs, InGaAs, Si, Se, TlBr, $HgI_2$ and $PbI_2$ and a sensor may comprise such materials. Most of the materials are suitable as X-ray sensors, although HgCdTe (Mercury Cadmium Telluride or MCT) and InGaAs (Indium Gallium Arsenide) may be used for infrared detection. Preferably, the sensor of each pixel is formed from (that is, comprises) GaAs. This may be useful for X-ray detection. More preferably, the sensor of each pixel is formed from GaAs compensated with chromium, referred to as GaAs(Cr). This material may provide further benefits in radiation hardness especially over known CdTe-based materials and Si-based materials. Other benefits of the GaAs(Cr) material over detectors based on other materials may include: better stopping power for high energy X-rays (that is, better counting efficiency); and room temperature operation (for example, compared to HPGe-based detectors that may require cryogenic cooling). The sensor tile may be formed using a standard process, although an epitaxially grown material can optionally be used.

In some embodiments, each pixel of the array further comprises interface CMOS circuitry, coupled to the sensor and configured to receive the imaging signal and provide the samples from the imaging signal to the CCD array. The imaging signal may be a current signal. The interface CMOS circuitry may therefore comprise a preamplifier or charge amplifier, configured to sense the imaging signal and provide the samples from the imaging signal as voltage signals to the CCD array. Thus, the preamplifier or charge amplifier may convert the charge stored in the sensor to a voltage signal, which then may be stored again as a charge in the CCD array. Thus, a charge proportional to the voltage output of the preamplifier or charge amplifier may then be generated. This may permit a controlled impedance and/or gain.

Optionally, the interface CMOS circuitry may comprise an integrator or charge integration node. One possible mechanism for storing a charge proportional to a voltage may be a 'fill-and-spill' technique. A preamplifier or charge amplifier may not be necessary, though. For example, the sensor may be directly coupled to the CCD array, for example with a passive collection node. Such a mechanism for transferring the charge efficiently from the sensor into the CCD array may demand less power and permit smaller pitch devices (perhaps as low as 30 microns).

The hybrid pixel sensor array preferably further comprises a transfer gate between the sensor and the CCD array. Although the term gate is used repeatedly in the disclosure, this is not to be understood as meaning a gate electrode alone. Rather, it includes a gate electrode, gate oxide and channel of a charge-coupled device. The transfer gate may acts as a barrier between the sensor or preamplifier and the CCD technology of the storage array.

The CCD array optionally comprises a pass entry gate, configured to receive the samples of the imaging signal from the sensor. Preferably, the pass entry gate is configured to receive the samples of the imaging signal from the transfer gate. Additionally or alternatively, the CCD array further comprises a pass exit gate, arranged to couple to the active CMOS circuitry. The pass exit gate acts as a barrier between the CCD technology of the storage array and the active CMOS circuitry.

In the preferred embodiment, the hybrid pixel sensor array further comprises an anti-blooming gate arranged between the sensor and a DC reference voltage. The DC reference voltage is preferably a supply voltage.

Beneficially, the active CMOS circuitry comprises a source follower transistor, having a gate that is arranged to receive the stored samples of the imaging signal from the CCD array. Preferably, the active CMOS circuitry further comprises a row select transistor arranged in series with the source follower transistor, and having a gate that is configured to receive a row select signal. More preferably, the active CMOS circuitry further comprises a reset transistor having a gate that is configured to receive a reset signal and a source and drain that are coupled between a reference DC voltage and the gate of the source follower transistor.

In the preferred embodiment, the CCD array comprises at least one row of CCD registers. Advantageously, each row of CCD registers comprises: a first vertical CCD register; a series configuration of one or more lateral CCD registers coupled to the first vertical CCD register at one end; and a second vertical CCD register coupled to the other end of the series configuration of one or more lateral CCD registers. Thus, the CCD array may comprise a repeating unit of CCD registers formed in rows. Preferably, each row of CCD registers further comprises a buffer entry gate arranged to couple the first vertical CCD register to the series configuration of one or more lateral CCD registers. More preferably, each row of CCD registers further comprises a buffer exit gate arranged to couple the series configuration of one or more lateral CCD registers to the second vertical CCD register.

In some embodiments, each CCD register comprises a plurality of gates in a series configuration, preferably first, second and third gates. This may use a three phase charge transfer. Alternatively, a different number of gates per CCD register may be provided to use a different number of phases for charge transfer. Two or four phase charge transfer are used in other technologies, for instance. Virtual phase may also be used. Using three phases can be advantageous with regard to ease of manufacture, reduced risk, increased robustness and other issues. Where each CCD register comprises first, second and third gates in a series configuration, the second gate of each first vertical CCD register of each row may be coupled to the buffer entry gate and the second gate of each second vertical CCD register of each row may be coupled to the buffer exit gate.

In preferred embodiments, the CCD array comprises a plurality of rows of CCD registers. Then, the first vertical CCD registers of the rows may be connected in series and the second vertical CCD registers of the rows may be connected in series. Thus, charge can be coupled between repeating rows of CCD registers for storage in a shift-register type of arrangement. Where each CCD register comprises first, second and third gates in a series configuration, the first vertical CCD registers of the rows may be connected in series such that the third gate of the first vertical CCD register of one row is coupled to the first gate of the first vertical CCD register of the row directly beneath the one row and the second vertical CCD registers of the rows may be connected in series such that the third gate of the second vertical CCD register of one row is coupled to the second gate of the first vertical CCD register of the row directly beneath the one row.

Where each CCD register comprises first, second and third gates in a series configuration, the one or more lateral CCD registers of each row are preferably connected in series such that the third gate of one lateral CCD register of a row is coupled to the first gate of a lateral CCD register of the row that is immediately adjacent the one lateral CCD register and closer to the second vertical CCD register of the row than the one lateral CCD register.

In some embodiments, the first gate of the first vertical CCD register of the first row is arranged to receive the samples of the imaging signal from the sensor. Additionally or alternatively, the third gate of the second vertical CCD register of the last row may be arranged to couple to the active CMOS circuitry.

The CCD array preferably comprises: a semiconductor layer (which may form part of the readout ASIC) with doping of a first conductivity type; an oxide layer on the surface of the semiconductor layer; and a plurality of gate electrodes on the oxide layer, each gate electrode defining a respective gate of the CCD array. More preferably, at least part of the transfer gate (typically, the channel) is formed in the semiconductor layer. An oxide and a gate electrode may then be formed on the semiconductor layer, to complete the transfer gate. The other gates may be formed using a similar structure.

In some embodiments, the CCD array further comprises: a barrier layer formed in the semiconductor layer and having a different doping characteristic from the semiconductor layer. The barrier layer may alternatively be termed a protection layer. The barrier layer is preferably a deep implant layer. Optionally, the barrier layer has a different dopant concentration than the semiconductor layer. In some embodiments, the dopant concentration of the barrier layer is higher than the dopant concentration of the semiconductor layer. Additionally or alternatively, the barrier layer may be formed from a different material than the semiconductor layer. The barrier layer may reduce contamination of stored charge packets from noise sources such as: stray charge diffusing in the substrate; dark current (thermally generated carriers); and both. The barrier layer is beneficially a passive protection method. Charge may be reflected by the barrier formed at a change in doping concentration.

In embodiments, the barrier layer has doping of a second conductivity type (advantageously, opposite to the first conductivity type). Normally, this will constitute an active protection method: the diode it forms may attract and collect charge from the substrate, removing it from the pixel. Beneficially, the hybrid pixel sensor array further comprises a barrier layer contact arrangement, arranged to allow the voltage of the barrier layer of each pixel to be set. This is especially advantageous when the barrier layer forms a diode. In some embodiments, the barrier layer contact arrangement comprises a plurality of barrier layer contacts, each barrier layer contact being configured to receive a voltage and provide that voltage to the barrier layer of a respective pixel. In other embodiments, the barrier layer contact arrangement comprises a barrier layer contact formed at the edge of the hybrid pixel sensor array and configured to receive a voltage and provide that voltage to the barrier layer of each pixel. In this way, a single contact can provide the voltage to the barrier layers across multiple pixels. This arrangement could be beneficial in reducing the complexity of the pixels and hence improving the fill factor.

In embodiments, the barrier layer may be a single layer formed across multiple pixels.

In embodiments, the CCD array further comprises a semiconductor substrate upon which the semiconductor layer is arranged. This may be an actual substrate layer in manufacturing or fabrication terms, but alternatively it may be nothing more than another semiconductor layer on which the semiconductor layer may be formed. Advantageously, the semiconductor layer is an epitaxial layer. Preferably, the dopant concentration of the semiconductor substrate is lower than the dopant concentration of the semiconductor layer. Beneficially, the semiconductor substrate has the first conductivity type.

In the preferred embodiment, the first conductivity type is p-type.

In a second aspect of the present invention, there is provided an hybrid imaging sensor comprising the hybrid pixel sensor array as disclosed herein. The imaging sensor optionally further comprises addressing circuitry for activating one or more pixels of the hybrid pixel sensor array. In the preferred embodiment, the imaging sensor further comprises: readout circuitry, for receiving the pixel output signal for each pixel activated by the addressing circuitry.

Optionally, the hybrid pixel sensor array is arranged in two dimensions as rows and columns of pixels. Then, the addressing circuitry may be configured to activate a row of pixels at any one time. Preferably, the readout circuitry is arranged to receive the pixel output signal for each pixel in the activated row at the same time.

In embodiments, at least part of the hybrid imaging sensor, preferably comprising the CCD array and active CMOS circuitry but not necessarily including the hybrid sensor, is formed on a semiconductor layer (for example, as discussed above). Then, the CCD array may comprise a plurality of gate electrodes formed on one surface of the semiconductor layer.

In another aspect, there is provided a method of operating a pixel of a hybrid pixel sensor array comprising a plurality of such pixels, the method comprising: detecting an imaging signal at a sensor; receiving and storing samples of the imaging signal in a Charged-Coupled Device, CCD, array, coupled to the sensor; and generating a pixel output signal from the stored samples at active CMOS circuitry that is coupled to the CCD array.

The present invention may also be found in a method of manufacture, operation or both of the hybrid pixel sensor array disclosed herein. The combination of any of the apparatus, device or method features described herein is also provided even if not explicitly disclosed.

BRIEF DESCRIPTION OF THE DRAWINGS

The invention may be put into practice in various ways, one of which will now be described by way of example only and with reference to the accompanying drawings in which.

DETAILED DESCRIPTION OF A PREFERRED EMBODIMENT

Figure 1:
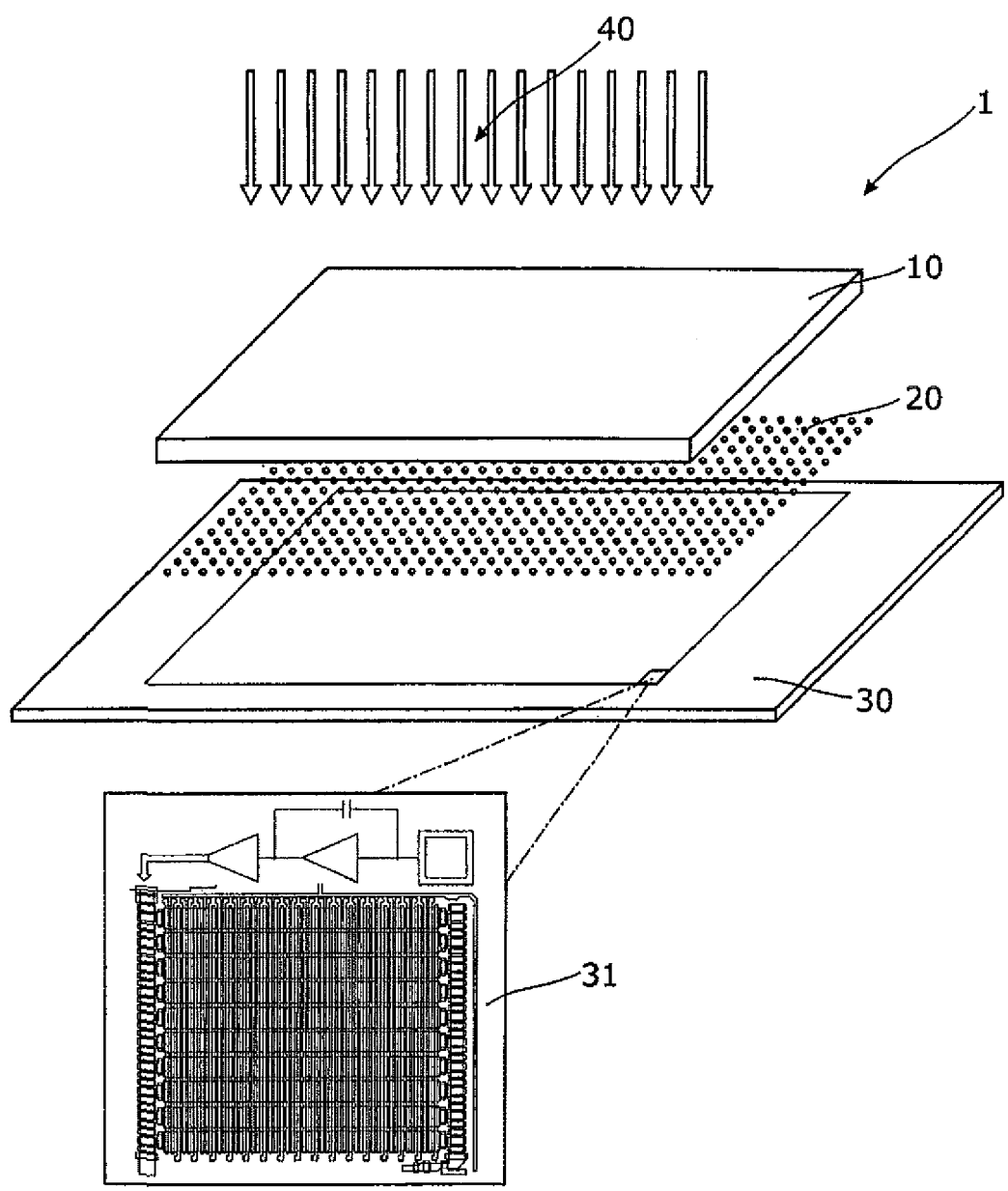
FIG. 1 depicts an exploded schematic diagram of an X-ray imaging sensor in accordance with the present invention.

Referring first to FIG. 1, there is depicted an exploded schematic diagram of an X-ray imaging sensor in accordance with the present invention. The X-ray imaging sensor 1 comprises: a sensor tile 10; a bump ray 20; and a readout ASIC 30. X-rays 40 impinge on the sensor tile 10 as shown.

The sensor tile 10 comprises 462×384 pixels at 60 μm pitch. This is an active area of 27.7 mm×23.0 mm. There are therefore 177,000 pixels per sensor. The sensor tile 10 has a thickness of approximately 500 μm and is bonded to the 180 nm readout ASIC 30 using the bump array 20. The bump array 30 preferably comprises bump-bond pads for indium or solder assembly. The readout ASIC 30 is then wire-bonded to analogue readout system. Digitalisation and further processing can be carried out off chip.

Figure 2:
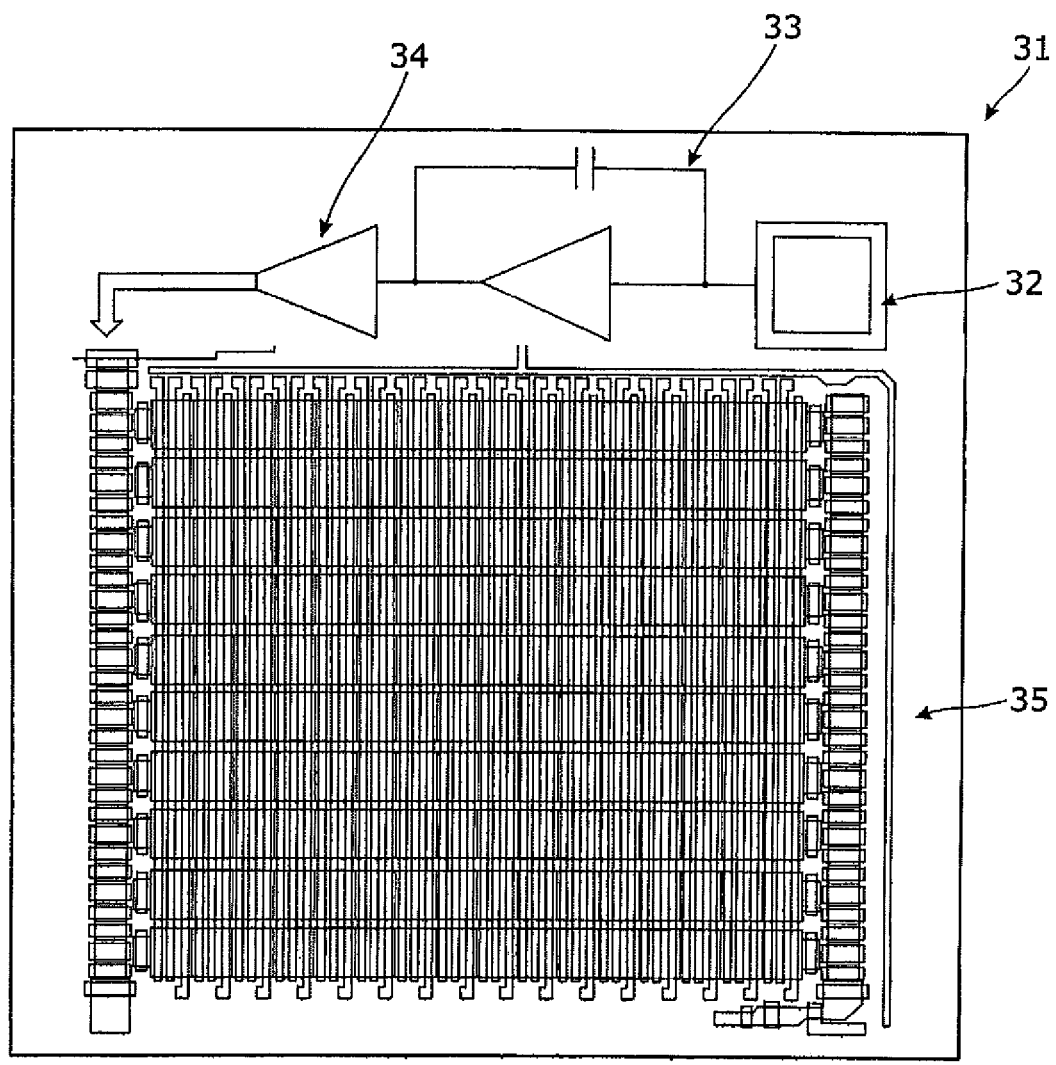
FIG. 2 schematically illustrates a single pixel of the X-ray imaging sensor of FIG. 1.

An expanded view of a single pixel element 31 on the readout ASIC 30 is shown. Referring now to FIG. 2, there is schematically illustrated a single pixel 31 of the X-ray imaging sensor in a clearer view. The pixel architecture 31 comprises: a bump-bond pad 32; a preamplifier comprising an integrator 33 and amplifier 34; and a CCD array 35. This provides a single gain 5 MHz frame capture amplifier, transistor and memory CCD in each pixel. To provide dynamic range, the pixel architecture includes a 100-200 fF charge integrator 33. 200-400 photons can be detected at 12 keV.

The CCD array 35 is based on the architecture shown and described in our co-pending patent application GB1300190.4. This could maintain more memory than is read out, for example, if readout skips unwanted cells. Various geometries are possible depending on the application requirements. Power may be saved between bunches as limited CCD clocking is required in that period.

A 'fill and spill' method is used for loading the CCD array 35 from the charge amplifier output. An input register is provided for implementing veto latency. The two-dimensional CCD matrix then optimises transfer efficiency for long memory. CCD readout can take place in the 100 ms pulse gap that is used in the XFEL design.

Figure 3:
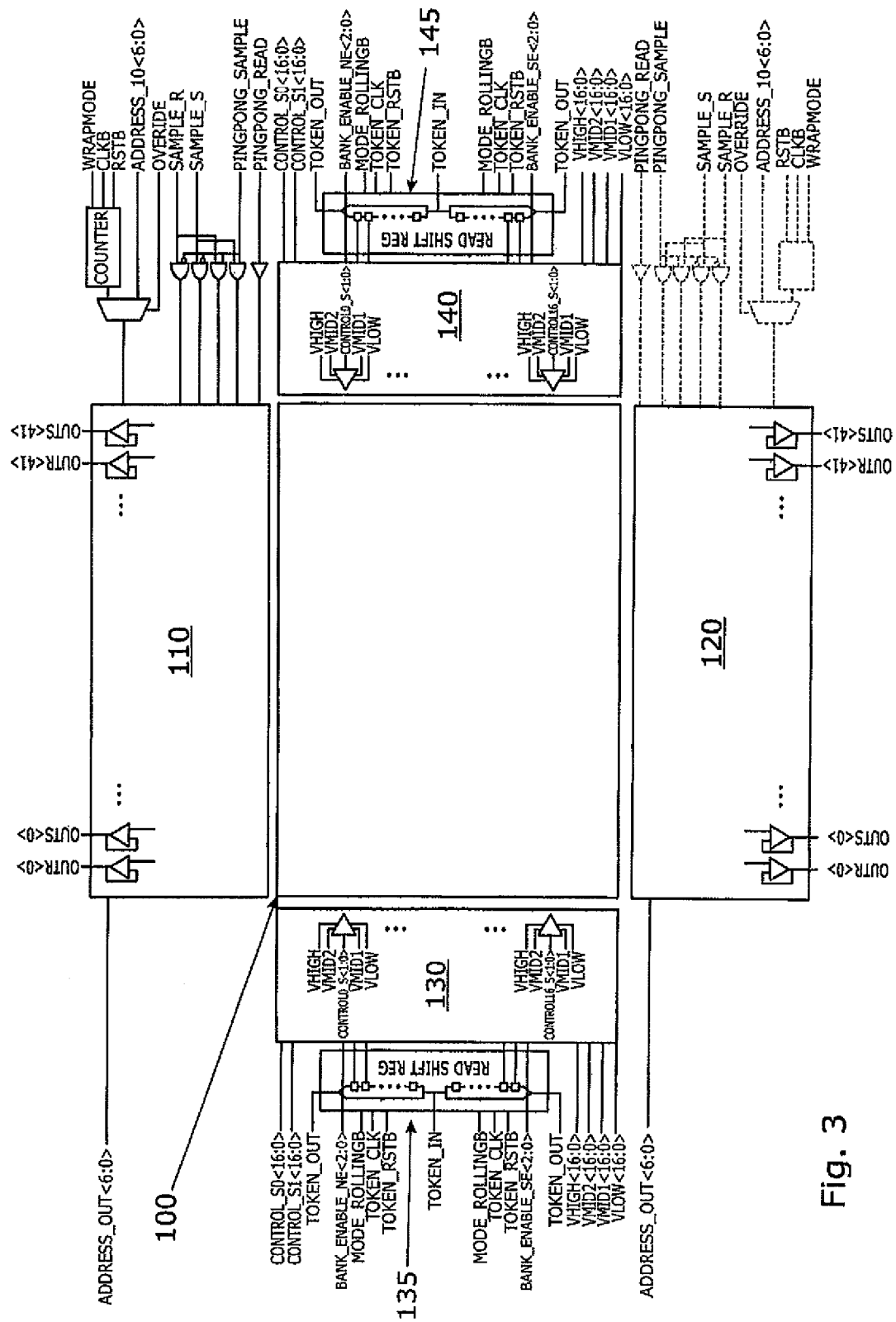
FIG. 3 shows a layout of the readout circuitry for an X-ray imaging sensor based on the design shown in FIG. 1.

Referring next to FIG. 3, there is shown a layout of the readout circuitry for an X-ray imaging sensor based on the design shown in FIG. 1. This comprises: the pixel circuitry array 100; first column readout circuitry 110; second column readout circuitry 120; first CCD driver circuitry 130; and second CCD driver circuitry 140. A first read shift register structure 135 is associated with the first CCD driver circuitry 130 and a second read shift register structure 145 is associated with the second CCD driver circuitry 140.

The pixel circuitry array 100 comprises an array of pixels 31, each of which may be in accordance with the design shown in FIG. 2. The array 100 of FIG. 3 comprises a two-dimension configuration of 462×484 pixels at 60 μm pitch.

Hence, the pixel circuitry array 100 from both sides, with a break in the pixel read lines in the centre of the array. In order to maintain uniform pixel circuitry, the load device that completes the pixel read source-follower may be located at the bottom of the column, rather than the furthest point as is conventional. Further details on the design of the pixel array may be found in our co-pending patent application GB1300190.4.

Figure 4:
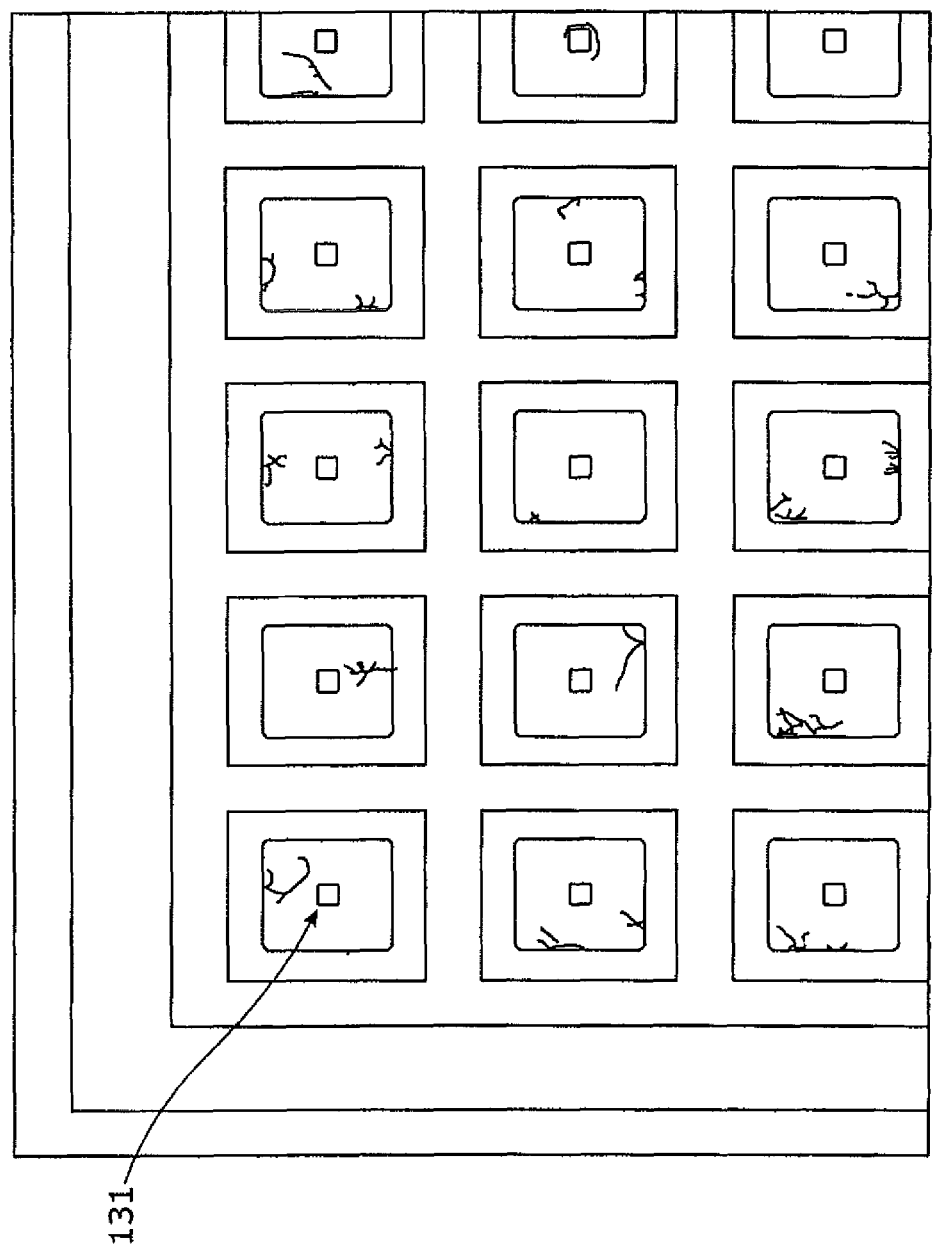
FIG. 4 shows pixelated X-ray sensors for use with the design shown in FIG. 1.

Referring now to FIG. 4, there is shown pixelated X-ray sensors for use with the design shown in FIG. 1. A number of pixel sensors 131 are shown. A GaAs material is used for the sensor tile. This has a high stopping power for 12 keV and reduces the dose received by the readout ASIC. The radiation hardness of the sensor is therefore improved. The material may also be useful for higher energies up to around 30 keV. This may be highly desirable, as it may allow facilities such as XFEL to operate at new higher energy modes. Preferably, a Cr compensated material is used. The CCD transfer efficiency, which is a key system performance driver, is thereby improved. The benefits of such a material are described "Characterisation of a GaAs(Cr) Medipix2 Hybrid Pixel Detector", L. Tlustos et al. Nuclear Instruments and Methods in Physics Research A 633 (2011) S103-S107.

Although a specific embodiment of the invention has now been described, the skilled person will understand that various variations and modifications may be made. Many of these are discussed in our co-pending patent application GB1300190.4. These mainly relate to the design of the readout ASIC portion.

Although a GaAs X-ray sensor is preferably used, alternatives may be possible, in particular CdZnTe, Si, Se, TlBr, $HgI_2$ and $PbI_2$. A preamplifier as discussed above may not be necessary, as it may be possible to couple the X-ray sensor and CCD array directly. A larger CCD array may then be possible. Additionally or alternatively, a different structure of sensor tile and ASIC may be possible, for example with different bonding techniques.

The preferred embodiment described above is an X-ray sensor. However, any type of imaging sensor may be possible. For example, an infrared detector could be implemented (based on a CdHgTe-based sensor, for instance). Other types of photo-imaging may also be applicable this type of hybrid sensor.

The pixel pitch may be designed using an appropriate figure for specific applications, as would be understood by the skilled person. For example, the pitch may be as small as 30 μm or as large as 100 μm.

The invention claimed is:

1. A hybrid pixel sensor array, each pixel of the array comprising:
    a sensor for generating an imaging signal;
    a Charged-Coupled Device, CCD, array, coupled to the sensor so as to receive samples from the imaging signal and configured for storage of a plurality of samples; and
    active CMOS circuitry, coupled to the CCD array for generating a pixel output signal from the stored samples; and
    wherein the sensors of the pixels are part of a sensor portion of the hybrid pixel sensor array that is separate from both the CCD array and active CMOS circuitry of the pixels, the sensor portion is a sensor tile on which the sensors of the pixel are arranged in a two-dimensional array, the sensor tile being separated from the CCD array and active CMOS circuitry of the pixels in a third dimension, different from the two dimensions of the array, the CCD array and active CMOS circuitry of the pixels are formed on a readout Application Specific Integrated Circuit (ASIC) and wherein the sensor tile is bonded to the readout ASIC and the sensor tile is bonded to the readout ASIC in a flip-chip arrangement.

2. The hybrid pixel sensor array of claim 1, wherein the sensor tile is bonded to the readout ASIC using at least one bump-bond pad.

3. The hybrid pixel sensor array of claim 2, wherein the at least one bump-bond pad comprises Indium.

4. The hybrid pixel sensor array of claim 1, wherein the sensor tile is bonded to the readout ASIC using solder.

5. The pixel sensor array of claim 1, wherein the bonding between the sensor tile and the readout ASIC provides coupling between the sensor of each pixel on the sensor tile and the CCD array of the respective pixel on the readout ASIC.

6. The hybrid pixel sensor array of claim 1, further comprising biasing circuitry, configured to provide a biasing voltage across the sensor of each pixel.

7. The hybrid pixel sensor array of claim 1, wherein the sensor of each pixel is formed from GaAs.

8. The hybrid pixel sensor array of claim 1, wherein the sensor of each pixel is an X-ray sensor.

9. The hybrid pixel sensor array of claim 1, wherein each pixel of the array further comprises:
   interface CMOS circuitry, coupled to the sensor and configured to receive the imaging signal and provide the samples from the imaging signal to the CCD array.

10. The hybrid pixel sensor array of claim 9, wherein the imaging signal is a current signal, the interface CMOS circuitry comprising a charge amplifier, configured to sense the imaging signal and provide the samples from the imaging signal as voltage signals to the CCD array.

11. The hybrid pixel sensor array of claim 9, wherein the interface CMOS circuitry comprises an integrator or charge integration node.

12. The hybrid pixel sensor array of claim 9, wherein the interface CMOS circuitry comprises a reset device for the sensor of the pixel.

13. The hybrid pixel sensor array of claim 1, further comprising a transfer gate between the sensor and the CCD array.

14. The hybrid pixel sensor array of claim 1, wherein the CCD array comprises a pass entry gate, configured to receive the samples from the detection signal.

15. The hybrid pixel sensor array of claim 1, wherein the CCD array comprises a pass exit gate, arranged to couple to the active CMOS circuitry.

16. The hybrid pixel sensor array of claim 1, wherein the active CMOS circuitry comprises:
   a source follower transistor, having a gate that is arranged to receive the stored samples of the imaging signal from the CCD array;
   a row select transistor arranged in series with the source follower transistor, and having a gate that is configured to receive a row select signal; and
   a reset transistor having a gate that is configured to receive a reset signal and a source and drain that are coupled between a reference DC voltage and the gate of the source follower transistor.

17. The hybrid pixel sensor array of claim 1, wherein the CCD array comprises at least one row of CCD registers, each row of CCD registers comprising:
   a first vertical CCD register;
   a series configuration of one or more lateral CCD registers coupled to the first vertical CCD register at one end; and
   a second vertical CCD register coupled to the other end of the series configuration of one or more lateral CCD registers.

18. The hybrid pixel sensor array of claim 17, wherein each row of CCD registers further comprises:
   a buffer entry gate arranged to couple the first vertical CCD register to the series configuration of one or more lateral CCD registers; and
   a buffer exit gate arranged to couple the series configuration of one or more lateral CCD registers to the second vertical CCD register.

19. The hybrid pixel sensor array of claim 17, wherein each CCD register comprises a plurality of gates in a series configuration.

20. The hybrid pixel sensor array of claim 19, wherein each CCD register comprises first, second and third gates in the series configuration, wherein the second gate of each first vertical CCD register of each row is coupled to the buffer entry gate and wherein the second gate of each second vertical CCD register of each row is coupled to the buffer exit gate.

21. The hybrid pixel sensor array of claim 17, wherein the CCD array comprises a plurality of rows of CCD registers, wherein the first vertical CCD registers of the rows are connected in series and wherein the second vertical CCD registers of the rows are connected in series.

22. The hybrid pixel sensor array of claim 21, wherein each CCD register comprises first, second and third gates in a series configuration, wherein the first vertical CCD registers of the rows are connected in series such that the third gate of the first vertical CCD register of one row is coupled to the first gate of the first vertical CCD register of the row directly beneath the one row and wherein the second vertical CCD registers of the rows are connected in series such that the third gate of the second vertical CCD register of one row is coupled to the second gate of the first vertical CCD register of the row directly beneath the one row.

23. The hybrid pixel sensor array of claim 21, wherein each CCD register comprises first, second and third gates in a series configuration and wherein the one or more lateral CCD registers of each row are connected in series such that the third gate of one lateral CCD register of a row is coupled to the first gate of a lateral CCD register of the row that is immediately adjacent the one lateral CCD register and closer to the second vertical CCD register of the row than the one lateral CCD register.

24. The hybrid pixel sensor array of claim 22, wherein:
   the first gate of the first vertical CCD register of the first row is arranged to receive the samples from the detection signal; and
   the third gate of the second vertical CCD register of the last row is arranged to couple to the active CMOS circuitry.

25. A hybrid imaging sensor comprising the hybrid pixel sensor array of claim 1.

26. The hybrid imaging sensor of claim 25, further comprising:
   addressing circuitry for activating one or more pixels of the hybrid pixel sensor array; and
   readout circuitry, for receiving the pixel output signal for each pixel activated by the addressing circuitry.

27. The hybrid imaging sensor of claim 26, wherein the hybrid pixel sensor array is arranged in two dimensions as rows and columns of pixels, the addressing circuitry being configured to activate a row of pixels at any one time and wherein the readout circuitry, is arranged to receive the pixel output signal for each pixel in the activated row at the same time.

28. The hybrid pixel sensor array of claim 1 wherein the pitch of the sensor for each pixel is no greater than 60 microns.

29. The hybrid pixel sensor array of claim 1 wherein the sensor of each pixel is formed from GaAs compensated with chromium.

30. A hybrid pixel sensor array, each pixel of the array comprising:
   a sensor for generating an imaging signal;
   a Charged-Coupled Device, CCD, array, coupled to the sensor so as to receive samples from the imaging signal and configured for storage of a plurality of samples; and active CMOS circuitry, coupled to the CCD array for generating a pixel output signal from the stored samples; and wherein the sensors of the pixels are part of a sensor portion of the hybrid pixel sensor array that is separate from both the CCD array and active CMOS circuitry of the pixels, and wherein the pitch of the sensor for each pixel is no greater than 60 microns.

31. A hybrid pixel sensor array, each pixel of the array comprising:

a sensor for generating an imaging signal;

a Charged-Coupled Device, CCD, array, coupled to the sensor so as to receive samples from the imaging signal and configured for storage of a plurality of samples; and active CMOS circuitry, coupled to the CCD array for generating a pixel output signal from the stored samples; and wherein the sensors of the pixels are part of a sensor portion of the hybrid pixel sensor array that is separate from both the CCD array and active CMOS circuitry of the pixels, and wherein the sensor of each pixel is formed from GaAs compensated with chromium.

\* \* \* \* \*